(12) United States Patent
Na et al.

(10) Patent No.: US 11,695,252 B2
(45) Date of Patent: *Jul. 4, 2023

(54) STRUCTURED LIGHT PROJECTOR AND ELECTRONIC APPARATUS INCLUDING THE SAME

(71) Applicant: SAMSUNG ELECTRONICS CO., LTD., Suwon-si (KR)

(72) Inventors: Byunghoon Na, Suwon-si (KR); Jangwoo You, Seoul (KR); Namseop Kwon, Suwon-si (KR); Minkyung Lee, Suwon-si (KR); Seunghoon Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 145 days.

This patent is subject to a terminal disclaimer.

(21) Appl. No.: 17/185,582

(22) Filed: Feb. 25, 2021

(65) Prior Publication Data

US 2021/0203133 A1    Jul. 1, 2021

Related U.S. Application Data

(63) Continuation of application No. 16/242,427, filed on Jan. 8, 2019, now Pat. No. 10,965,102.

(Continued)

(30) Foreign Application Priority Data

Jun. 18, 2018 (KR) .................. 10-2018-0069626

(51) Int. Cl.
*H01S 5/00* (2006.01)
*H01S 5/183* (2006.01)
*H01S 5/42* (2006.01)

(52) U.S. Cl.
CPC .......... *H01S 5/18388* (2013.01); *H01S 5/005* (2013.01); *H01S 5/18394* (2013.01); *H01S 5/423* (2013.01)

(58) Field of Classification Search
CPC . G02B 3/08; G02B 1/002; G02B 5/08; G02B 5/1809; G02B 5/189; G02B 27/425;
(Continued)

(56) References Cited

U.S. PATENT DOCUMENTS 7,460,749 B2  12/2008  Ueno et al.
8,339,696 B2  12/2012  Miyatake et al.
(Continued)

FOREIGN PATENT DOCUMENTS

JP    4193709 B2    12/2008
JP    4931060 A     5/2012
(Continued)

OTHER PUBLICATIONS

Communication dated Oct. 30, 2022, issued by the Korean Intellectual Property Office in Korean Patent Application No. 10-2018-0069626.

*Primary Examiner* — Isiaka O Akanbi
(74) *Attorney, Agent, or Firm* — Sughrue Mion, PLLC

(57) ABSTRACT

Provided are a structured light projector that generates and projects structured light, and an electronic apparatus including the structured light projector. The structured light projector includes an illuminator configured to emit light, a pattern mask configured to form structured light by partially transmitting and partially blocking incident light from the illuminator based on a pattern of the pattern mask, and a lens configured to project the structured light. The illuminator includes a plurality of illumination areas respectively facing a plurality of areas of the pattern mask, wherein intensities (Continued)

of lights respectively emitted by the plurality of illumination areas are different from one other.

20 Claims, 15 Drawing Sheets

Related U.S. Application Data

(60) Provisional application No. 62/656,751, filed on Apr. 12, 2018.

(58) Field of Classification Search
CPC ...... G02B 5/008; G02B 3/06; G02B 19/0057; G01B 11/25; G01B 11/2513; G01B 11/22; G01S 7/4814; G01S 17/48; G03B 21/142; G03B 21/2033; F21V 5/045; F21V 11/08; F21V 13/02
USPC ........................................................ 356/610
See application file for complete search history.

(56) References Cited

U.S. PATENT DOCUMENTS

| | | | |
|---|---|---|---|
| 9,995,859 B2 | 6/2018 | Kamali | |
| 10,488,651 B2 | 11/2019 | Kamali | |
| 10,670,782 B2 | 6/2020 | Arbabi | |
| 10,965,102 B2 * | 3/2021 | Na | ............. G02B 27/18 |
| 10,982,954 B2 * | 4/2021 | Kwon | ............ G01B 11/2513 |
| 2005/0195374 A1 | 9/2005 | Akiyama | |
| 2013/0250066 A1 * | 9/2013 | Abraham | ............. H04N 13/128 |
| | | | 348/46 |
| 2014/0376092 A1 | 12/2014 | Mor | |
| 2015/0141267 A1 * | 5/2015 | Rothberg | ............. G01N 21/64 |
| | | | 250/208.2 |
| 2015/0377414 A1 | 12/2015 | Pirseyedi | |
| 2016/0191867 A1 | 6/2016 | Abraham | |
| 2016/0197452 A1 | 7/2016 | Mor | |
| 2016/0299337 A1 | 10/2016 | Arbabi | |
| 2016/0352073 A1 | 12/2016 | Dummer et al. | |
| 2017/0082263 A1 | 3/2017 | Byrnes | |
| 2017/0351111 A1 | 12/2017 | Jeong | |
| 2018/0059430 A1 | 3/2018 | Mor | |
| 2019/0137762 A1 | 5/2019 | Hu | |
| 2019/0154877 A1 | 5/2019 | Capasso | |
| 2020/0051263 A1 | 2/2020 | Han et al. | |
| 2022/0373789 A1 | 11/2022 | Arbabi et al. | |

FOREIGN PATENT DOCUMENTS

| | | |
|---|---|---|
| KR | 10-2015-0035513 A | 4/2015 |
| KR | 10-2016-0120653 A | 10/2016 |
| KR | 10-2017-0112915 A | 10/2017 |
| WO | 2017176921 A1 | 10/2017 |

* cited by examiner

STRUCTURED LIGHT PROJECTOR AND ELECTRONIC APPARATUS INCLUDING THE SAME

CROSS-REFERENCE TO RELATED PATENT APPLICATION

This application is a continuation of U.S. application Ser. No. 16/242,427, filed Jan. 8, 2019, which claims priority from U.S. Provisional Patent Application No. 62/656,751, filed on Apr. 12, 2018, in the U.S. Patent and Trademark Office, and priority from Korean Patent Application No. 10-2018-0069626, filed on Jun. 18, 2018, in the Korean Intellectual Property Office, the disclosures of which are incorporated herein in their entireties by reference.

BACKGROUND

1. Field

Example embodiments of the present disclosure relate to a structured light projector and an electronic apparatus including the same.

2. Description of the Related Art

Recently, in recognition of an object, such as a human or a thing, a need to accurately identify a shape, location, movement, or the like of the object due to precise three-dimensional (3D) shape recognition has been increasing. In this regard, a 3D sensing technology using structured light has been proposed, and accordingly, a more improved precise action recognition has become possible.

Recently, there has been a need for the structured light system to have a smaller size and higher resolution in order to be coupled with various electronic apparatuses. To form structured light, optical components, such as a diffractive optical element (DOE), may be used. The optical characteristics of such optical components may affect the design precision and manufacturing conditions of the structured light system.

SUMMARY

According to an aspect of an example embodiment, there is provided a structured light projector including an illuminator configured to emit light, a pattern mask comprising a plurality of areas, the pattern mask being configured to generate structured light from light emitted by the illuminator based on a pattern of the pattern mask, and a lens configured to project the structured light, wherein the illuminator includes a plurality of illumination areas respectively facing the plurality of areas of the pattern mask, and wherein intensities of lights respectively emitted by the plurality of illumination areas are different from each other.

The illuminator may include a first illumination area facing a peripheral portion of the pattern mask and a second illumination area facing a center portion of the pattern mask, the illuminator may include a plurality of first light-emitting elements disposed in the first illumination area and a plurality of second light-emitting elements disposed in the second illumination area, and an intensity of light emitted by the first illumination area may be greater than an intensity of light emitted by the second illumination area.

The intensity of the light emitted by the first illumination area and the intensity of the light emitted by the second illumination area may be set based on a distortion of the lens such that brightness of the structured light is uniform across a cross-section of the structured light.

The structured light projector, wherein an intensity of a current applied to the plurality of first light-emitting elements disposed in the first illumination area may be greater than an intensity of current applied to the plurality of second light-emitting elements disposed in the second illumination area.

The structured light projector, wherein a time period during which the current is applied to the plurality of first light-emitting elements disposed in the first illumination area may be longer than a time period during which the current is applied to the plurality of second light-emitting elements disposed in the second illumination area.

The structured light projector, wherein a density of the plurality of first light-emitting elements disposed in the first illumination area may be higher than a density of the plurality of second light-emitting elements disposed in the second illumination area.

The structured light projector, wherein an aperture diameter of each of the plurality of first light-emitting elements disposed in the first illumination area may be greater than an aperture diameter of each of the plurality of second light-emitting elements disposed in the second illumination area.

The first light-emitting element and the second light-emitting element may include vertical cavity surface emitting lasers (VCSELs), respectively, each having an aperture layer, and an inner diameter of the aperture layer in the VCSEL of each of the first light-emitting elements may be greater than an inner diameter of the aperture layer in the VCSEL of each of the second light-emitting elements.

The pattern mask, the first illumination area, and the second illumination area may have rectangular shapes.

The structured light projector, wherein each of the pattern mask, the first illumination area, and the second illumination area may have a quadrangular shape with rounded corners and convex sides.

The pattern mask may include four sides, the four sides including a first side and a fourth side opposite each other, and a second side and a third side opposite to each, a length of the first side may be shorter than a length of the fourth side, and the second side may be inclined upward from the fourth side to the first side and the third side may be inclined downward from the fourth side to the first side.

The pattern mask may include a first area, a second area, a third area, and a fourth are corresponding to the first side, the second side, the third side, and the fourth side, respectively, and the illuminator may include a first illumination area facing the first area of the pattern mask, a second illumination area facing the second area of the pattern mask, a third illumination area facing the third area of the pattern mask, and a fourth illumination area facing the fourth area of the pattern mask.

The intensities of lights respectively emitted by the second and third illumination areas may be greater than an intensity of light emitted by the fourth illumination area, an intensity of light emitted by the first illumination area may be greater than the intensities of the lights respectively emitted by the second and third illumination areas, and the intensity of the light emitted by the second illumination area may be equal to the intensity of the light emitted by the third illumination area.

The intensities of the lights respectively emitted by the first through fourth illumination areas may be set based on a distortion of the lens such that brightness of the structured light is uniform across a cross-section of the structured light.

The fourth illumination area from among the first through fourth illumination areas may have a largest area.

The illuminator may include a plurality of first light-emitting elements disposed in the first illumination area, a plurality of second light-emitting elements disposed in the second illumination area, a plurality of third light-emitting elements disposed in the third illumination area, and a plurality of fourth light-emitting elements disposed in the fourth illumination area.

The structured light projector, wherein an intensity of a current applied to the plurality of first light-emitting elements disposed in the first illumination area may be greater than intensities of currents respectively applied to the plurality of second and third light-emitting elements disposed in the second and third illumination areas, the intensities of the currents respectively applied to the plurality of second and third light-emitting elements disposed in the second and third illumination areas may be greater than an intensity of current applied to the plurality of fourth light-emitting elements disposed in the fourth illumination area, and the intensity of the current applied to the plurality of second light-emitting elements disposed in the second illumination area may be equal to the intensity of the current applied to the plurality of third light-emitting elements disposed in the third illumination area.

The structured light projector, wherein a time period during which a current is applied to the plurality of first light-emitting elements disposed in the first illumination area may be longer than time periods during which currents are respectively applied to the plurality of second and third light-emitting elements disposed in the second and third illumination areas, the time periods during which the currents are respectively applied to the plurality of second and third light-emitting elements disposed in the second and third illumination areas may be longer than a time period during which current is applied to the plurality of fourth light-emitting elements disposed in the fourth illumination area, and the time period during which the current is applied to the plurality of second light-emitting elements disposed in the second illumination area may be equal to the time period during which the current is applied to the plurality of third light-emitting elements disposed in the third illumination area.

The structured light projector, wherein a density of the plurality of first light-emitting elements disposed in the first illumination area may be higher than densities of the plurality of second and third light-emitting elements respectively disposed in the second and third illumination areas, the densities of the plurality of second and third light-emitting elements respectively disposed in the second and third illumination areas may be higher than a density of the plurality of fourth light-emitting elements disposed in the fourth illumination area, and the density of the plurality of second light-emitting elements disposed in the second illumination area may be equal to the density of the plurality of third light-emitting elements disposed in the third illumination area.

The structured light projector, wherein an aperture diameter of each of the plurality of first light-emitting elements disposed in the first illumination area may be greater than an aperture diameter of each of the plurality of second light-emitting elements disposed in the second illumination area and an aperture diameter of each of the plurality of third light-emitting elements disposed in the third illumination area, The aperture diameters of the plurality of second and third light-emitting elements respectively disposed in the second and third illumination areas are greater than an aperture diameter of each of the plurality of fourth light-emitting elements disposed in the fourth illumination area, and the aperture diameter of each of the plurality of second light-emitting elements disposed in the second illumination area may be equal to the aperture diameter of each of the plurality of third light-emitting elements disposed in the third illumination area.

The structured light projector may further include a transparent substrate spaced apart from the illuminator, wherein the pattern mask may be disposed on a first surface of the transparent substrate, and the lens may be disposed on a second surface of the transparent substrate opposite to the pattern mask.

The lens may be a meta lens including a plurality of nano-size columns.

According to an aspect of an example embodiment, there is provided an electronic apparatus including a structured light projector configured to project structured light to an object, a sensor configured to receive light reflected by the object, and a processor configured to obtain shape information of the object based on the light received by the sensor, wherein the structured light projector includes an illuminator configured to emit light, a pattern mask comprising a plurality of areas, the pattern mask being configured to generate structured light from light emitted by the illuminator based on a pattern of the pattern mask, and a lens configured to project the structured light, wherein the illuminator includes a plurality of illumination areas respectively facing a plurality of areas of the pattern mask, and wherein intensities of lights respectively emitted by the plurality of illumination areas are different from each other.

BRIEF DESCRIPTION OF THE DRAWINGS

The above and/or other aspects will become apparent and more readily appreciated from the following description of the example embodiments, taken in conjunction with the accompanying drawings in which.

DETAILED DESCRIPTION

Figure 1:
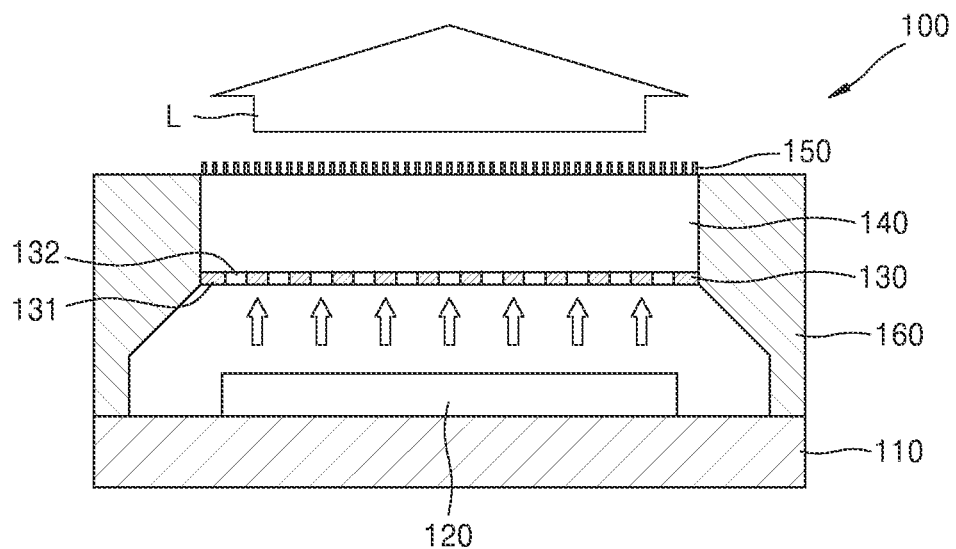
FIG. 1 is a schematic cross-sectional view of a structured light projector according to an example embodiment.

A structured light projector and an electronic apparatus including the same will now be described in detail with reference to the accompanying drawings. Like reference numerals in the drawings denote like elements, and, in the drawings, the sizes of elements may be exaggerated for clarity and for convenience of explanation. In this regard, example embodiments may have different forms and should not be construed as being limited to the descriptions set forth herein. It will be understood that when a layer is referred to as being "on" another layer or substrate, it can be directly on/below/on the left side of/on the right side of the other layer or substrate, or intervening layers may also be present.

As used herein, the term "and/or" includes any and all combinations of one or more of the associated listed items. It will be further understood that the terms "comprises" and/or "comprising" used herein specify the presence of stated features or elements, but do not preclude the presence or addition of one or more other features or elements.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a schematic cross-sectional view of a structured light projector according to an example embodiment. Referring to FIG. 1, a structured light projector 100 according to an example embodiment may include an illuminator 120 emitting light, a pattern mask 130 forming structured light by partially transmitting or blocking incident light, and a lens 150 for projecting the structured light. The structured light projector 100 may further include a support 110 for supporting the illuminator 120, a transparent substrate 140 for supporting the pattern mask 130 and the lens 150, and a housing 160 for fixing the transparent substrate 140. The housing 160 may be a certain distance apart from the illuminator 120. A lower end portion of the housing 160 may be coupled to the support 110, and the transparent substrate 140 may be fixed to an upper end portion of the housing 160.

The lens 150 may be arranged on an upper surface of the transparent substrate 140. The lens 150 may be, for example, a meta-lens including nano columns having a nano size. The nano columns may have a size of a sub wavelength that is less than a wavelength of light emitted by the illuminator 120. In an example embodiment, a diameter of each of the nano columns and a layout pitch of a plurality of nano columns may be less than ½ of the wavelength of the light emitted by the illuminator 120. Optical characteristics of the lens 150 may be determined according to the height and diameter of each nano column, the layout pitch of the plurality of nano columns, and a layout form of the plurality of nano columns. In an example embodiment, a plurality of nano columns may be arranged such that the lens 150 may serve as a convex lens or condensing lens that collects light on a focal plane. When the lens 150 includes nano columns, the lens 150 may be formed to be very thin, compared with general refracting optical lenses, and may suppress high-level diffraction over a wide angle range, compared with general diffracting optical lenses. Accordingly, the structured light projector 100 may have an very small size. In an example embodiment, the structured light projector 100 may have a height of about 4 mm or less.

The lens 150 may include a material having a refractive index that is higher than that of the transparent substrate 140. In an example embodiment, the refractive index of the lens 150 may be greater than that of the transparent substrate 140 by more than 1. The lens 150 may include, in an example embodiment, single crystal silicon (Si), polycrystal Si, amorphous Si, silicon nitride ($Si_3N_4$), gallium phosphide (GaP), titanium dioxide ($TiO_2$), aluminum antimonide (AlSb), alumanylidynearsane (AlAs), aluminum gallium arsenide (AlGaAs), aluminium gallium indium phosphide (AlGaInP), boron phosphide (BP), or zinc germanium phosphide ($ZnGeP_2$). In an example embodiment, the lens 150 may include a metal material.

The lens 150 may include a metal material having relatively high conductivity to cause a surface plasmon excitation. In an example embodiment, the lens 150 may include copper (Cu), aluminum (Al), nickel (Ni), iron (Fe), carbon monoxide (Co), zinc (Zn), titanium (Ti), ruthenium (Ru), rhodium (Rh), palladium (Pd), platinum (Pt), silver (Ag), osmium (Os), iridium (Ir), or gold (Au), or an alloy of these materials. In an example embodiment, the lens 150 may include a two-dimensional (2D) material having high conductivity, such as graphene, or conductive oxide.

Figure 2:
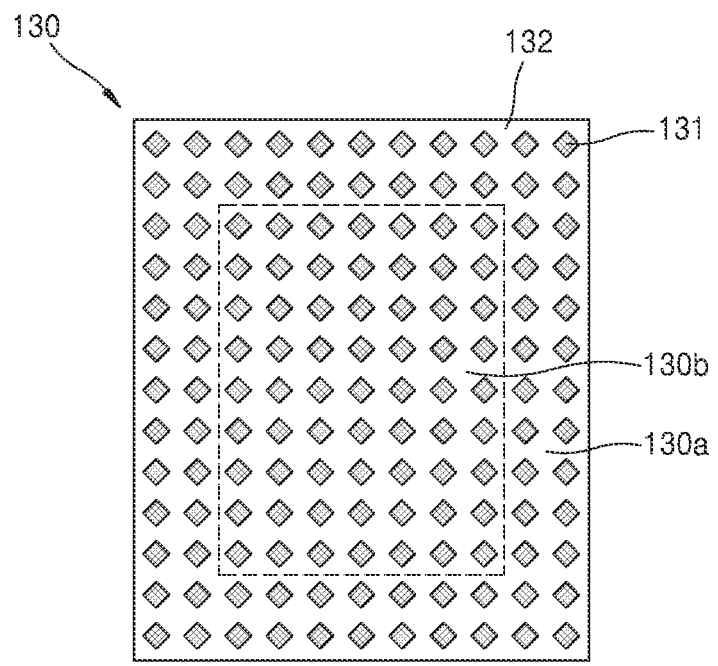
FIG. 2 is a plan view of an example of a pattern mask employed in the structured light projector of FIG. 1.

The pattern mask 130 may be arranged on a lower surface of the transparent substrate 140, opposite to the lens, such that the pattern mask 130 faces the illuminator 120. The pattern mask 130 may form structured light by partially transmitting and partially blocking the light emitted by the illuminator 120 based on a pattern of the pattern mask. In an example embodiment, FIG. 2 is a plan view of an example of the pattern mask 130 employed in the structured light projector 100 of FIG. 1. Referring to FIG. 2, the pattern mask 130 may include a light-shielding area 131 that reflects or absorbs incident light, and a light-transmitting area 132 surrounded by the light-shielding area 131. The light-transmitting area 132 may transmit the incident light. Accordingly, the incident light may pass through the light-transmitting area 132 and the transparent substrate 140, and may be projected to outside of the structured light projector 100 via the lens 150.

Because a portion of the light provided by the illuminator 120 is blocked by the light-shielding area 131 and only a portion of the light passes through the pattern mask 130, structured light having a certain pattern may be formed. The structured light may be a distribution of beam spots formed by rays of light progressing in a certain space. The distribution of beam spots may be determined by the shape of the light-transmitting area 132 and an array form of a plurality of light-transmitting areas 132. The structured light may be a pattern mathematically coded to uniquely designate angles, directions, and location coordinates of bright and dark dots when the bright and dark points reach corresponding points on a focusing plane. This pattern may be used to recognize a three-dimensional (3D) shape. The shape of the structured light radiated to a 3D object may vary due to the 3D object, and the degrees of shape changes of respective patterns for the coordinates may be traced by imaging the shape variation with an image pick-up device, such as a camera. Thus, depth information of the 3D object may be extracted.

In an example embodiment, as illustrated in FIG. 2, a plurality of light-shielding areas 131 each having a diamond shape may be arranged uniformly in a two-dimensional (2D) array. However, this is merely an example of the pattern mask 130, and the shape of each light-shielding area 131 and an array form of the plurality of light-shielding areas 131 are not limited thereto, and various modifications may be made. In an example embodiment, the pattern mask 130 may be formed by etching a metal layer, a black matrix layer, and a polymer layer after forming the metal layer, the black matrix layer, and the polymer layer on the lower surface of the transparent substrate 140.

Figure 3:
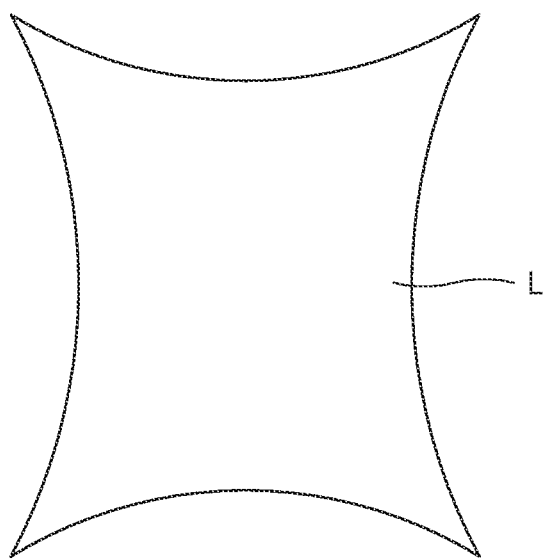
FIG. 3 illustrates a cross-sectional shape of structured light projected by a structured light projector when the pattern mask of FIG. 2 is employed.

FIG. 2 illustrates the pattern mask 130 having a rectangular shape. In this case, a cross-section of the structured light may have a shape other than a rectangle, due to distortion of the lens 150. FIG. 3 illustrates a cross-sectional shape of the structured light projected by the structured light projector 100 when the pattern mask 130 of FIG. 2 is used. Referring to FIG. 3, when the lens 150 has pincushion distortion, wherein image magnification increases with the distance from the optical axis and light that does not go through the center portion are bowed inwards towards the center, corners of structured light L may expand, and thus a center portion of each side of the structured light L may become concave. Then, a center area of the structured light L emitted from the center portion 130b of the pattern mask 130 may be relatively bright and an edge area of the structured light L emitted from the peripheral portion 130a of the pattern mask 130 may be relatively dark. Thus, an average brightness of the structured light L may not be uniform in a cross-section of the structured light.

According to an example embodiment, average brightness uniformity of the structured light may be increased by locally adjusting the brightness of the light emitted by the illuminator 120. For example, FIG. 4 is a plan view for illustrating an example of a layout of light-emitting elements in the illuminator 120 employed in the structured light projector 100 of FIG. 1 when the pattern mask 130 of FIG. 2 is used.

Figure 4:
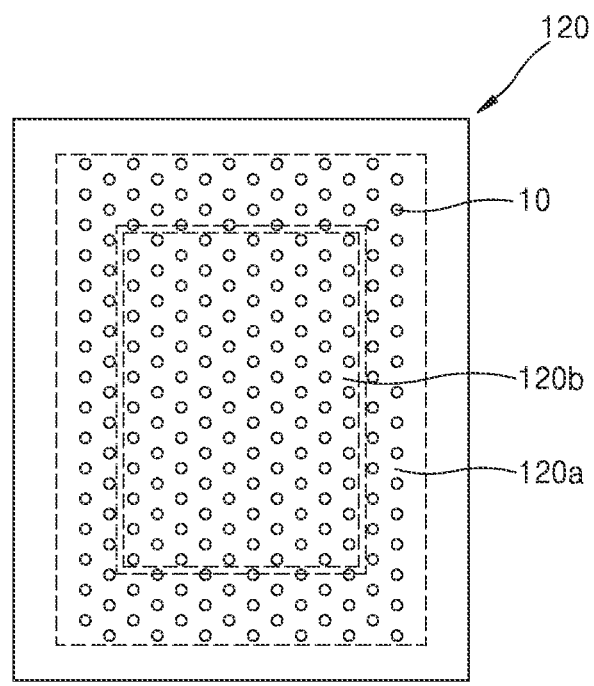
FIG. 4 is a plan view illustrating an example of a layout of light-emitting elements in an illuminator employed in the structured light projector of FIG. 1 when the pattern mask of FIG. 2 is employed.

Referring to FIG. 4, the illuminator 120 may include a plurality of light-emitting elements 10 arranged in a 2D array. The light-emitting elements 10 may be laser diodes that emit laser light. For example, the light-emitting elements 10 may be vertical cavity surface emitting lasers (VCSELs). When the light-emitting elements 10 are VCSELs, each light-emitting element 10 may include an active layer formed of a Groups III-V compound semiconductor material or a Groups II-VI compound semiconductor material and having a multi-quantum well (MQW) structure. However, the light-emitting elements 10 are not limited thereto. For example, the light-emitting element 10 may be laser diodes other than VCSELs or may be light-emitting diodes. The light-emitting elements 10 may emit light with a wavelength of about 850 nm or 940 nm, or may emit light in a wavelength band of near-infrared light. However, the wavelength of light emitted by the light-emitting elements 10 is not particularly limited, and light-emitting elements 10 emitting light in a wavelength band suitable for an application that utilizes the structured light may be used.

Referring to FIG. 4, a contour shape of a light-emitting area of the illuminator 120 on which the light-emitting elements 10 are arranged may be mostly identical with that of the pattern mask 130 of FIG. 2. In other words, the plurality of light-emitting elements 10 may be arranged within a rectangular area. The light-emitting area of the illuminator 120 may be divided into two areas. For example, the illuminator 120 may include a first illumination area 120a having a rectangular shape, and a second illumination area 120b having a rectangular shape. The first illumination area 120a in a peripheral portion of the illuminator 120 is arranged to surround the second illumination area 120b in a center portion thereof. The first illumination area 120a of the illuminator 120 may face the peripheral portion 130a of the pattern mask 130, and the second illumination area 120b of the illuminator 120 may face the center portion 130b of the pattern mask 130. An array form of the light-emitting elements 10 and a density thereof may be the same in the first illumination area 120a and the second illumination area 120b.

The first illumination area 120a and the second illumination area 120b of the illuminator 120 may be independently driven in order to reduce or prevent structured light having passed through the peripheral portion 130a of the pattern mask 130 from being darker than that having passed through the center portion 130b of the pattern mask 130. To this end, the illuminator 120 may be driven so that the intensity of the light emitted by the light-emitting elements 10 arranged in the first illumination area 120a is greater than that of the light emitted by the light-emitting elements 10 arranged in the second illumination area 120b.

Figure 5:
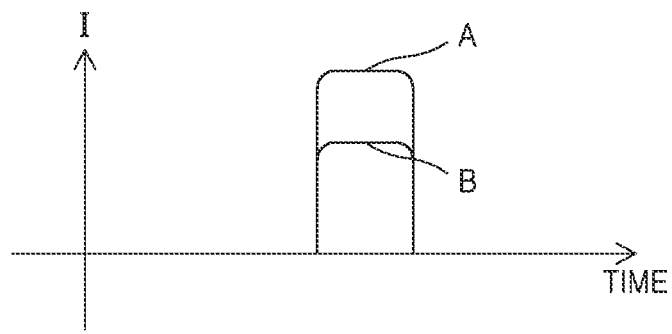
FIG. 5 is a graph showing an example of a method of driving the illuminator of FIG. 4.

According to an example embodiment, FIG. 5 is a graph showing an example of a driving method of the illuminator 120 of FIG. 4. Referring to FIG. 5, the intensity of current A applied to the light-emitting elements 10 arranged in the first illumination area 120a may be greater than that of current B applied to the light-emitting elements 10 arranged in the second illumination area 120b. Time periods during which currents are respectively applied to the light-emitting elements 10 arranged in the first and second illumination areas 120a and 120b may be the same as each other. Then, light output from the light-emitting elements 10 arranged in the first illumination area 120a may become greater than light output from the light-emitting elements 10 arranged in the second illumination area 120b. The intensity of the current A applied to the light-emitting elements 10 arranged in the first illumination area 120a and that of the current B applied to the light-emitting elements 10 arranged in the second illumination area 120b may be determined in consideration of a brightness difference between a center area and an edge area of structured light due to distortion of the lens 150.

Figure 6:
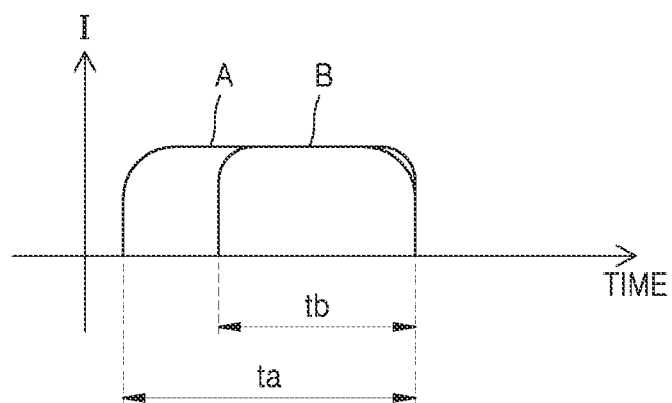
FIG. 6 is a graph showing an example of a method of driving the illuminator of FIG. 4.

FIG. 6 is a graph showing an example of a driving method of the illuminator 120 of FIG. 4. Referring to FIG. 6, the intensity of the current A applied to the light-emitting elements 10 arranged in the first illumination area 120a is the same as that of the current B applied to the light-emitting elements 10 arranged in the second illumination area 120b. The time periods during which currents are respectively applied to the light-emitting elements 10 arranged in the first and second illumination areas 120a and 120b may be different from each other. For example, a time period ta during which the current A is applied to the light-emitting elements 10 arranged in the first illumination area 120a may be longer than a time period tb during which the current B is applied to the light-emitting elements 10 arranged in the second illumination area 120b. The time period ta during which the current A is applied to the light-emitting elements 10 arranged in the first illumination area 120a and the time period tb during which the current B is applied to the light-emitting elements 10 arranged in the second illumination area 120b may be determined in consideration of the brightness difference between the center area and the edge area of the structured light due to distortion of the lens 150.

Although an example in which the illuminator 120 is divided into two areas is illustrated in FIGS. 4 through 6, the illuminator 120 may be divided into three or more areas which may be driven independently. For example, the illuminator 120 may include a center area, a first peripheral area surrounding the center area, and a second peripheral region surrounding the first peripheral area. In this case, the amount of current applied to the light-emitting elements 10 may gradually increase from the center area to the second peripheral area. Although FIG. 4 illustrates the second illumination area 120b having a rectangular shape, a shape other than a rectangle may be selected as the shape of the second illumination area 120b in consideration of distortion of the lens 150.

Figure 7:
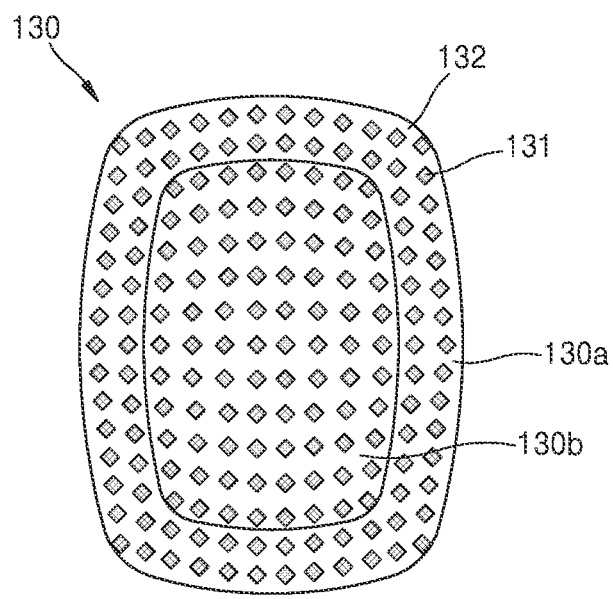
FIG. 7 is a plan view of an example of a pattern mask employed in the structured light projector of FIG. 1.
Figure 8:
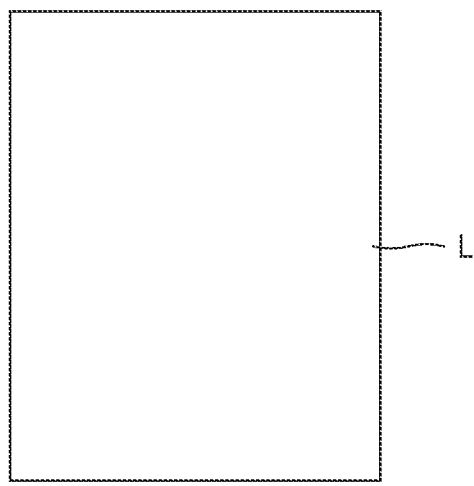
FIG. 8 illustrates a cross-sectional shape of structured light projected by a structured light projector when the pattern mask of FIG. 7 is employed.

FIG. 7 is a plan view of an example of the pattern mask 130 employed in the structured light projector 100 of FIG. 1, and FIG. 8 illustrates a cross-sectional shape of the structured light projected by the structured light projector 100 when the pattern mask 130 of FIG. 7 is used. Referring to FIG. 7, in consideration of distortion of the lens 150, corners of the pattern mask 130 may be rounded, and a center portion of each side of the pattern mask 130 may become convex. Then, when the lens 150 has pincushion distortion, the corners of the structured light L may expand and the center portion of each side of the structured light L may become concave, and thus, as shown in FIG. 8, the structured light L may have a rectangular shape. Also, in this case, a center area of the structured light L emitted from the center portion 130b of the pattern mask 130 may be relatively bright and an edge area of the structured light L emitted from the peripheral portion 130a of the pattern mask 130 may be relatively dark. Thus, the average brightness of the structured light L may not be uniform in a cross-section of the structured light L.

Figure 9:
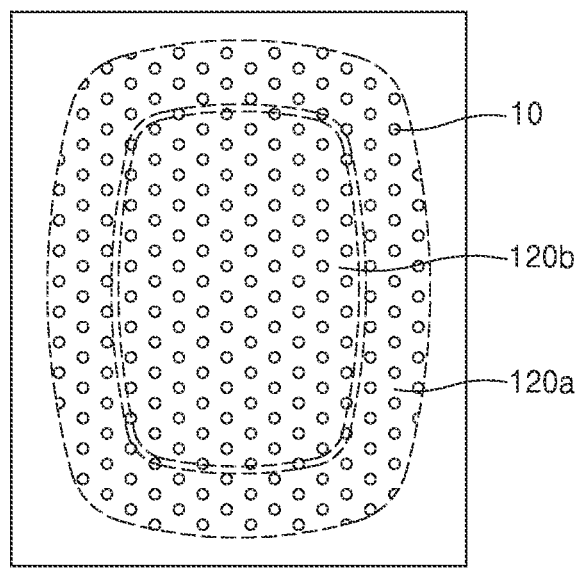
FIG. 9 is a plan view illustrating an example of a layout of light-emitting elements in an illuminator employed in the structured light projector of FIG. 1 when the pattern mask of FIG. 7 is employed.

FIG. 9 is a plan view illustrating an example of a layout of the light-emitting elements 10 in the illuminator 120 employed in the structured light projector 100 of FIG. 1 when the pattern mask 130 of FIG. 7 is used. Referring to FIG. 9, a contour shape of a light-emitting area of the illuminator 120 on which the light-emitting elements 10 are arranged may be mostly identical with that of the pattern mask 130 of FIG. 7. In other words, a plurality of light-emitting elements 10 may be arranged within a quadrangular area having round corners and convex sides.

The illuminator 120 may include a first illumination area 120a and a second illumination area 120b. The first illumination area 120a in a peripheral portion of the illuminator 120 may be arranged to surround the second illumination area 120b in a center portion thereof. The first illumination area 120a of the illuminator 120 may face the peripheral portion 130a of the pattern mask 130, and the second illumination area 120b of the illuminator 120 may face the center portion 130b of the pattern mask 130. An array form of the light-emitting elements 10 and a density thereof may be the same in the first illumination area 120a and the second illumination area 120b. Although FIG. 9 illustrates that respective contour shapes of the first illumination area 120a and the second illumination area 120b are similar to a contour shape of the pattern mask 130, the contour shape of the first illumination area 120a may be different from that of the second illumination area 120b in consideration of distortion of the lens 150.

The first illumination area 120a and the second illumination area 120b of the illuminator 120 may be independently driven in order to reduce or prevent structured light having passed through the peripheral portion 130a of the pattern mask 130 from being darker than that having passed through the center portion 130b of the pattern mask 130. For example, as described above with reference to FIG. 5, the intensity of current applied to the light-emitting elements 10 arranged in the first illumination area 120a may be greater than that of current applied to the light-emitting elements 10 arranged in the second illumination area 120b. In an example embodiment, as described above with reference to FIG. 6, a time period during which current is applied to the light-emitting elements 10 arranged in the first illumination area 120a may be longer than a time period during which current is applied to the light-emitting elements 10 arranged in the second illumination area 120b.

Figure 10:
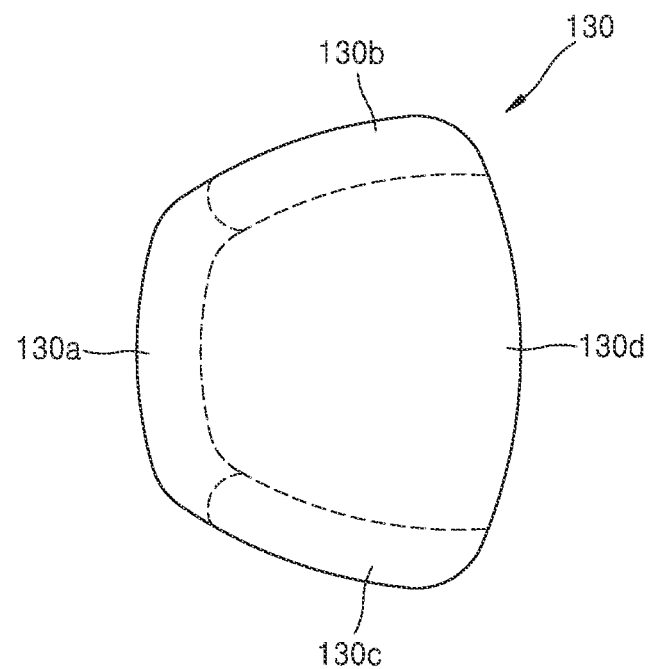
FIG. 10 is a plan view of an example of a pattern mask employed in the structured light projector of FIG. 1.

FIG. 10 is a plan view of an example of the pattern mask 130 employed in the structured light projector 100 of FIG. 1. Referring to FIG. 10, the pattern mask 130 may have a bilaterally asymmetrical shape. For example, the pattern mask 130 may have a generally trapezoidal shape of which a left side is shorter than a right side. Similar to the case of FIG. 7, corners of the pattern mask 130 may have rounded corners, and a center portion of each side thereof may have a convex shape. A lower side and an upper side of the pattern mask 130 may each be inclined upward and downward, respectively, from the left side to the right side.

Figure 11:
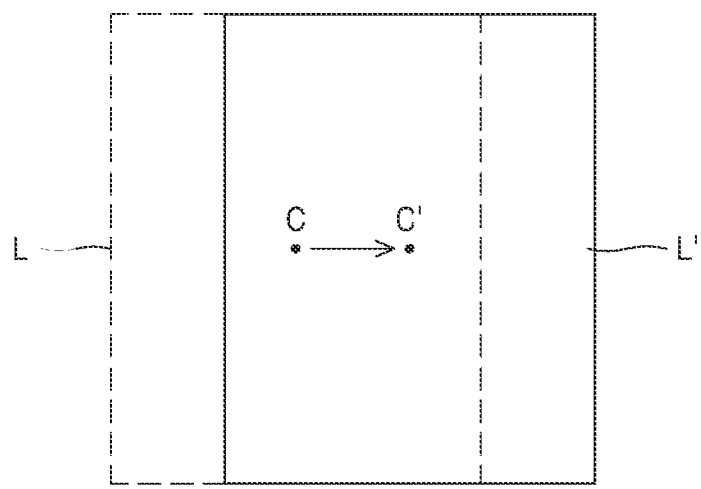
FIG. 11 illustrates a cross-sectional shape of structured light projected by a structured light projector when the pattern mask of FIG. 10 is employed.

In this case, the structured light focused by the lens 150 may have a generally rectangular cross-section while travelling at an angle toward a lateral side of the structured light projector 100 instead of a direction normal to the surface of the illuminator 120. For example, FIG. 11 illustrates a cross-sectional shape of the structured light projected by the structured light projector 100 when the pattern mask 130 of FIG. 10 is used. In FIG. 11, structured light L outlined by a dashed line rectangle is formed by the pattern mask 130 of FIG. 7, which is bilaterally symmetrical, and structured light L' outlined by a bold line rectangle is formed by the pattern mask 130 of FIG. 10, which is bilaterally asymmetrical. The structured light L formed by the symmetrical pattern mask 130 may be projected in an optical axis direction of the structured light projector 100, and thus, a center C of the structured light L may coincide with an optical axis of the structured light projector 100. On the other hand, the structured light L' formed by the bilaterally asymmetrical pattern mask 130 of FIG. 10 may be projected at an angle with respect to the optical axis of the structured light projector 100. Accordingly, a center C' of the structured light L' may move in a lateral direction with respect to the center C of the structured light L.

Various asymmetrical shapes of pattern masks 130 other than the asymmetrical shape of FIG. 10 may be used. For example, various pattern masks 130 with four sides having shapes in which two opposite sides have different lengths and the other two sides opposite to each other between the two opposite sides are inclined may be used. A direction in which the structured light L' is projected and a degree to which the structured light L' deviates from the optical axis of the structured light projector 100 may differ according to asymmetrical shapes of the pattern mask 130.

Figure 12:
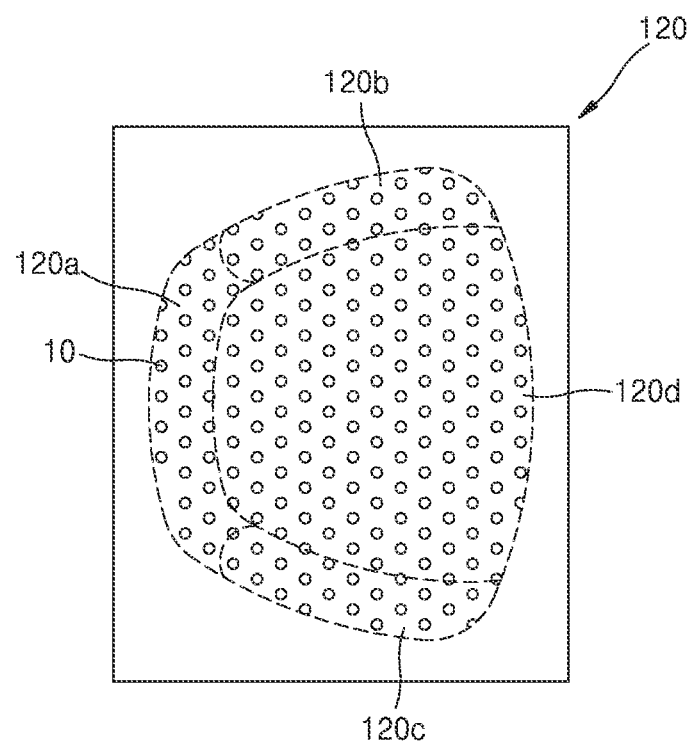
FIG. 12 is a plan view illustrating an example of a layout of light-emitting elements in an illuminator employed in the structured light projector of FIG. 1 when the pattern mask of FIG. 10 is employed.

FIG. 12 is a plan view illustrating an example of a layout of the light-emitting elements 10 in the illuminator 120 employed in the structured light projector 100 of FIG. 1 when the pattern mask 130 of FIG. 10 is used. Because the pattern mask 130 is bilaterally asymmetrical and the structured light travels at an angle with respect to the direction normal to the surface of the illuminator 120 of the structured light projector 100, brightness of the structured light may be different in a left area, a right area, and upper and lower areas of the structured light. Accordingly, as shown in FIG. 12, the illuminator 120 may be divided into four areas. In other words, the illuminator 120 may include a first illumination area 120a on the left side, a second illumination area 120b on the upper side, a third illumination area 120c on the lower side, and a fourth illumination area 120d on the right side. A plurality of light-emitting elements 10 may be arranged in a 2D array within the first through fourth illumination areas 120a, 120b, 120c, and 120d. An array form and a density of the light-emitting elements 10 may be the same in the first through fourth illumination areas 120a, 120b, 120c, and 120d.

An entire contour of the illuminator 120 may be generally identical with a contour of the pattern mask 130 of FIG. 10. The first illumination area 120a of the illuminator 120 may face a left area 130a of the pattern mask 130, the second illumination area 120b thereof may face an upper area 130b of the pattern mask 130, the third illumination area 120c thereof may face a lower area 130c of the pattern mask 130, and the fourth illumination area 120d thereof may face a right area 130d of the pattern mask 130.

Figure 13:
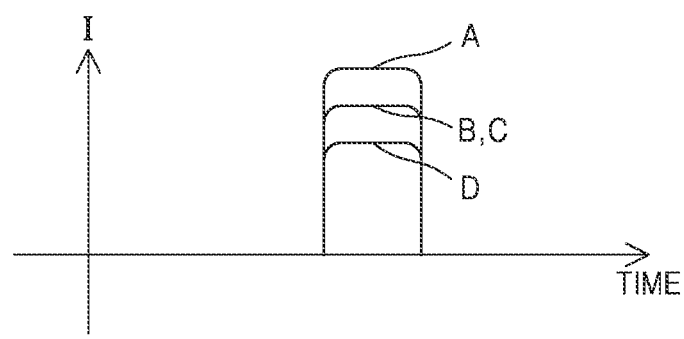
FIG. 13 is a graph showing an example of a method of driving the illuminator of FIG. 12.

FIG. 13 is a graph showing an example of a driving method of the illuminator 120 of FIG. 12. In the structured light having passed through the pattern mask 130 of FIG. 10, a portion having passed through the left area 130a of the pattern mask 130 may have the largest distortion, and a portion having passed through the right area 130d of the pattern mask 130 may have the smallest distortion. Accordingly, referring to FIG. 13, current D applied to light-emitting elements 10 arranged in the fourth illumination area 120d may have the smallest intensity. Intensities of currents B and C applied to light-emitting elements 10 arranged in the second and third illumination areas 120b and 120c are greater than that of the current D applied to the light-emitting elements 10 arranged in the fourth illumination area 120d, and current A applied to light-emitting elements 10 arranged in the first illumination area 120a may have the largest intensity. The intensities of the currents B and C applied to the light-emitting elements 10 arranged in the second and third illumination areas 120b and 120c may be the same as each other. The intensities of the currents A, B, C, and D applied to the light-emitting elements 10 arranged in the first through fourth illumination areas 120a, 120b, 120c, and 120d may be determined in consideration of distortion of the lens 150.

Figure 14:
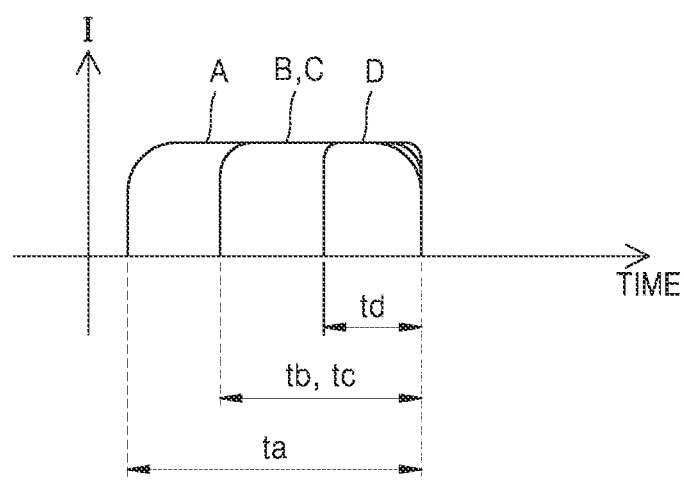
FIG. 14 is a graph showing an example of a method of driving the illuminator of FIG. 12.

FIG. 14 is a graph showing another example of a driving method of the illuminator 120 of FIG. 12. Referring to FIG. 14, the intensities of the currents A, B, C, and D applied to the light-emitting elements 10 arranged in the first through fourth illumination areas 120a, 120b, 120c, and 120d may be the same as each other. The time periods during which the currents A, B, C, and D are respectively applied to the light-emitting elements 10 may be different from each other. For example, a time period td during which the current D is applied to the light-emitting elements 10 arranged in the fourth illumination area 120d may be the shortest. Time periods tb and tc during which the currents B and C respectively applied to the light-emitting elements 10 arranged in the second and third illumination areas 120b and 120c may be longer than that the time period td during which the current D is applied to the light-emitting elements 10 arranged in the fourth illumination area 120d, and a time period to during which the current A is applied to the light-emitting elements 10 arranged in the first illumination area 120a may be the longest. The time periods tb and tc during which the currents B and C are applied to the light-emitting elements 10 arranged in the second and third illumination areas 120b and 120c may be the same as each other.

Referring to FIG. 12, the fourth illumination area 120d may be the widest, and the first through third illumination areas 120a, 120b, and 120c may surround the fourth illumination area 120d. However, detailed shapes of the first through fourth illumination areas 120a, 120b, 120c, and 120d of the illuminator 120 may vary according to distortion aspects of the lens 150. Although the illuminator 120 is divided into four areas in FIG. 12, for example, the fourth illumination area 120d, which is widest, may be further divided.

Figure 15:
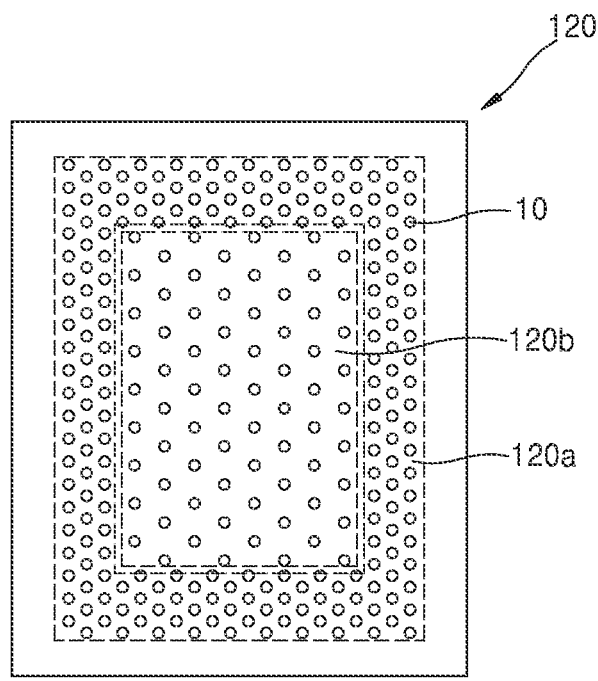
FIG. 15 is a plan view illustrating an example of a layout of light-emitting elements in an illuminator employed in the structured light projector of FIG. 1 when the pattern mask of FIG. 2 is employed.

FIG. 15 is a plan view illustrating an example of a layout of the light-emitting elements 10 in the illuminator 120 employed in the structured light projector 100 of FIG. 1 when the pattern mask 130 of FIG. 2 is used. Referring to FIG. 15, the illuminator 120 may have a rectangular shape, similar to the pattern mask 130 of FIG. 2. A plurality of light-emitting elements 10 may be arranged within a rectangular area. The illuminator 120 may include a first illumination area 120a facing the peripheral portion 130a of the pattern mask 130, and a second illumination area 120b facing the center portion 130b of the pattern mask 130. The contour shapes of the first illumination area 120a and the second illumination area 120b may be rectangular.

To compensate for brightness non-uniformity of the structured light due to distortion of the lens 150, an array form of the light-emitting elements 10 in the first illumination area 120a may be different from that of the second illumination area 120b of the illuminator 120. In an example embodiment, the number (i.e., a density) of light-emitting elements 10 in a unit area in the first illumination area 120a may be higher than a density of the light-emitting elements 10 in the second illumination area 120b. In this case, intensities of currents respectively applied to the light-emitting elements 10 arranged in the first and second illumination areas 120a and 120b, or time periods during which the currents are respectively applied thereto may be equal to each other. A density of the light-emitting elements 10 in the first illumination area 120a and a density of the light-emitting elements 10 in the second illumination area 120b may be determined in consideration of distortion of the lens 150.

Figure 16:
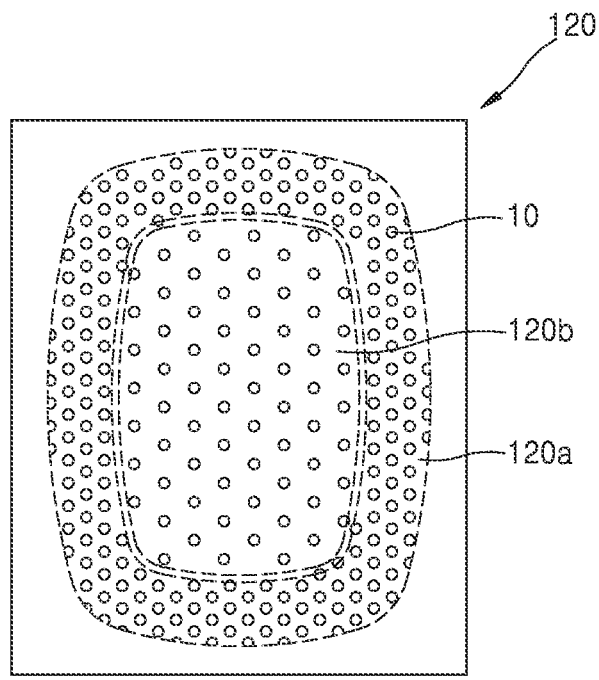
FIG. 16 is a plan view illustrating an example of a layout of light-emitting elements in an illuminator employed in the structured light projector of FIG. 1 when the pattern mask of FIG. 7 is employed.

FIG. 16 is a plan view illustrating an example of a layout of the light-emitting elements 10 in the illuminator 120 employed in the structured light projector 100 of FIG. 1 when the pattern mask 130 of FIG. 7 is used. Referring to FIG. 16, an entire contour of the illuminator 120 may be generally identical with a contour shape of the pattern mask 130 of FIG. 7. In other words, the illuminator 120 may have a quadrangular shape having rounded corners and convex sides. The illuminator 120 may include a first illumination area 120a facing the peripheral portion 130a of the pattern mask 130, and a second illumination area 120b facing the center portion 130b of the pattern mask 130. Each of the contour shapes of the first illumination area 120a and the second illumination area 120b may be a quadrangular shape having rounded corners and convex sides.

Similar to the example embodiment as illustrated in FIG. 15, to compensate for brightness non-uniformity of the structured light due to distortion of the lens 150, a density of the light-emitting elements 10 in the first illumination area 120a of the illuminator 120 may be different from that of the light-emitting elements 10 in the second illumination area 120b of the illuminator 120. For example, the density of the light-emitting elements 10 in the first illumination area 120a may be higher than that of the light-emitting elements 10 in the second illumination area 120b. Then, the intensity of light emitted by the first illumination area 120a may be greater than that of light emitted by the second illumination area 120b, and thus the brightness of the structured light may become more uniform.

Figure 17:
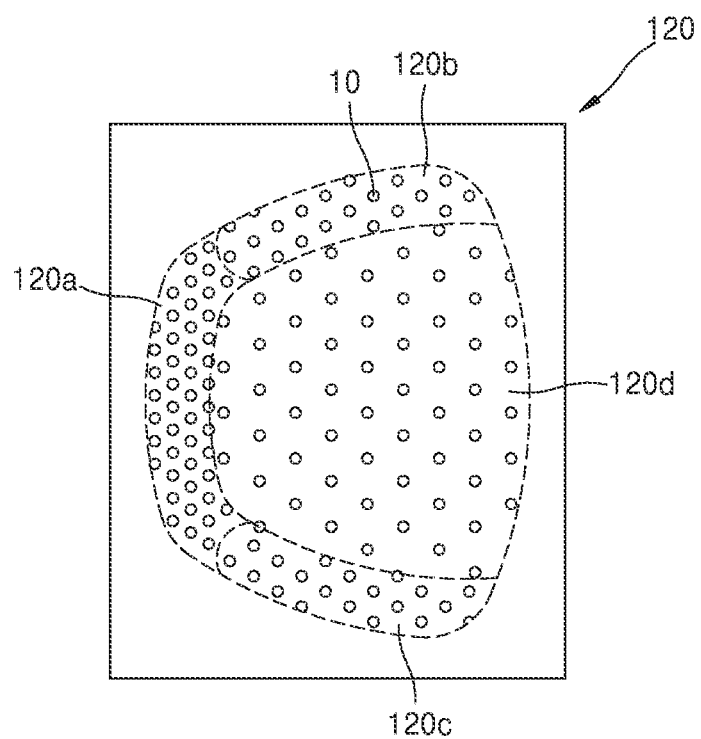
FIG. 17 is a plan view illustrating an example of a layout of light-emitting elements in an illuminator employed in the structured light projector of FIG. 1 when the pattern mask of FIG. 10 is employed.

FIG. 17 is a plan view illustrating an example of a layout of the light-emitting elements 10 in the illuminator 120 employed in the structured light projector 100 of FIG. 1 when the pattern mask 130 of FIG. 10 is used. Referring to FIG. 17, the illuminator 120 may be divided into four areas. In other words, the illuminator 120 may include a first illumination area 120a on the left side, a second illumination area 120b on the upper side, a third illumination area 120c on the lower side, and a fourth illumination area 120d on the right side.

A plurality of light-emitting elements 10 may be arranged within the first through fourth illumination areas 120a, 120b, 120c, and 120d of the illuminator 120. Respective densities of the light-emitting elements 10 in the first through fourth illumination areas 120a, 120b, 120c, and 120d may be different from each other. For example, light-emitting elements 10 may be arranged with a first density within the first illumination area 120a, light-emitting elements 10 may be arranged with a second density within the second illumination area 120b, light-emitting elements 10 may be arranged with a third density within the third illumination area 120c, and light-emitting elements 10 may be arranged with a fourth density within the fourth illumination area 120d. To compensate for brightness non-uniformity of the structured light due to distortion of the lens 150, the first density may be greater than the second density, and the second density and the third density may be equal to each other, and the second density may be greater than the fourth density. In this case, intensities of currents respectively applied to the light-emitting elements 10 arranged in the first and second illumination areas 120a, 120b, 120c, and 120d, or time periods during which the currents are respectively applied thereto may be equal to each other.

Figure 18:
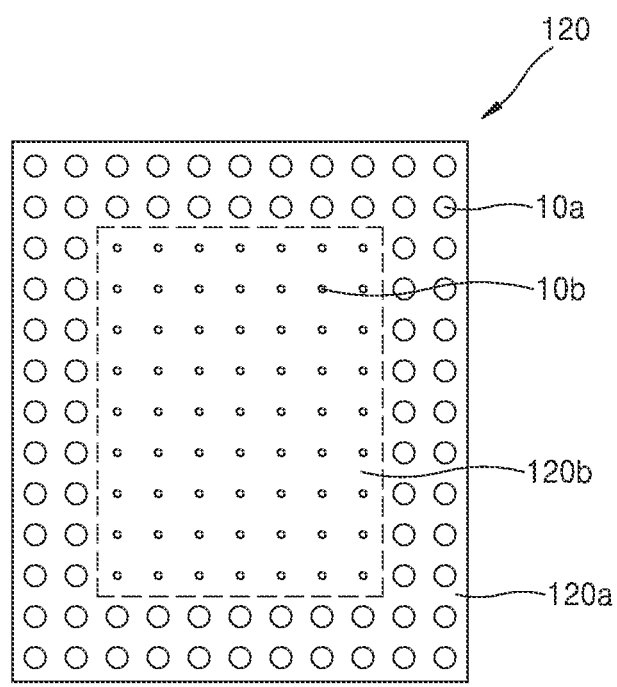
FIG. 18 is a plan view illustrating an example of a layout of light-emitting elements in an illuminator employed in the structured light projector of FIG. 1 when the pattern mask of FIG. 2 is employed.

FIG. 18 is a plan view illustrating an example of a layout of the light-emitting elements 10 in the illuminator 120 employed in the structured light projector 100 of FIG. 1 when the pattern mask 130 of FIG. 2 is used. Referring to FIG. 18, the illuminator 120 includes a first illumination area 120a in which first light-emitting elements 10a each having a first aperture diameter are arranged, and a second illumination area 120b in which second light-emitting elements 10b each having a second aperture diameter are arranged. Densities of the first and second light-emitting elements 10a and 10b in the first and second illumination areas 120a and 120b of the illuminator 120 may be equal to each other, and intensities of currents respectively applied to the first and second light-emitting elements 10a and 10b or time periods during which the currents are respectively applied thereto may be equal to each other.

The first aperture diameter of each of the first light-emitting elements 10a arranged in the first illumination area 120a may be different from the second aperture diameter of each of the second light-emitting elements 10b arranged in the second illumination area 120b. In an example embodiment, the first aperture diameter of each of the first light-emitting elements 10a arranged in the first illumination area 120a may be greater than the second aperture diameter of each of the second light-emitting elements 10b arranged in the second illumination area 120b. Then, even when the intensities of the currents respectively applied to the first and second light-emitting elements 10a and 10b or the time periods during which the currents are respectively applied thereto are equal to each other, the intensity of light emitted by each of the first light-emitting elements 10a arranged in the first illumination area 120a may be greater than that of light emitted by each of the second light-emitting elements 10b arranged in the second illumination area 120b.

Figure 19:
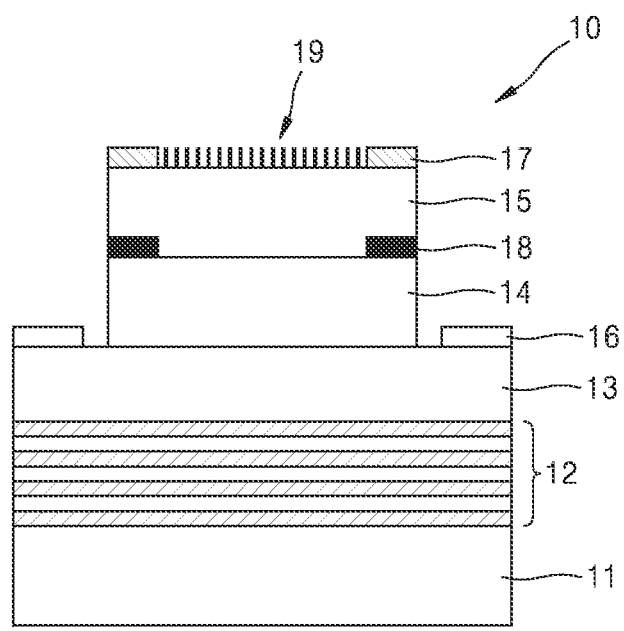
FIG. 19 is a schematic cross-sectional view of a structure of a light-emitting element employed in an illuminator according to an example embodiment.

According to an example embodiment, FIG. 19 is a schematic cross-sectional view of a structure of each light-emitting element 10 employed in the illuminator 120. Referring to FIG. 19, the light-emitting element 10 may have a VCSEL structure. The light-emitting element 10 having a VCSEL structure may include a semiconductor substrate 11, a first reflection layer 12 on the semiconductor substrate 11, a first semiconductor layer 13 on the first reflection layer 12, an active layer 14 on the first semiconductor layer 13, a second semiconductor layer 15 on the active layer 14, and a second reflection layer 19 on the second semiconductor layer 15. The light-emitting element 10 may also include a first electrode 16 arranged on an upper surface edge of the first semiconductor layer 13 exposed by etching the active layer 14 and the second semiconductor layer 15, and a second electrode 17 arranged on an upper surface edge of the second semiconductor layer 15.

The first reflection layer 12 may be a distributed Bragg reflector in which two material layers having different refractive indices alternate with each other. For example, the two material layers may be an $Al_xGa_{(1-x)}As$ layer (where $0 \leq x \leq 1$) and an $Al_yGa_{(1-y)}As$ layer (where $0 \leq y \leq 1$, $x \neq y$), but example embodiments are not limited thereto. Each material layer may have an optical thickness of about ¼ of an oscillation wavelength. The first reflection layer 12 and the first semiconductor layer 13 may be doped with a first conductive type of impurities, and the second semiconductor layer 15 may be doped with a second conductive type of impurities that is contrary to the first conductive type of impurities. For example, the first reflection layer 12 and the first semiconductor layer 13 may be doped with n-type impurities and the second semiconductor layer 15 may be doped with p-type impurities, or vice versa.

The active layer 14 generates light by absorbing energy. The active layer 14 may have, for example, a MQW structure including a plurality of quantum well layers and a plurality of barrier layers formed of indium gallium arsenide (InGaAs), AlGaAs, aluminum gallium nitride (AlGaN), indium gallium arsenide phosphide (InGaAsP), indium gallium phosphide (InGaP) or AlGaInP. Electrons and holes provided by the first semiconductor layer 13 and the second semiconductor layer 15 re-combine with each other in the active layer 14, thereby generating light.

The second reflection layer 19 may be a nanostructure reflector including a plurality of nanostructures each having a size of a sub-wavelength. For example, the size of each nanostructure may be smaller than the wavelength of light generated by the active layer 14. The light generated by the active layer 14 may resonate between the first reflection layer 12 and the second reflection layer 19, and light having a wavelength corresponding to a resonant wavelength of a resonator formed by the first reflection layer 12 and the second reflection layer 19 may be amplified and emitted to the outside via the second reflection layer 19.

The light-emitting element 10 may further include an aperture layer 18 for adjusting a mode of oscillating light or a beam size. The aperture layer 18 may be formed of, for example, $A_2O_3$. Alternatively, the aperture layer 18 may be formed by injecting high-concentration ions into an edge of the second semiconductor layer 15. An aperture diameter of each of the light-emitting elements 10 arranged in the first illumination area 120a and that of each of the light-emitting elements 10 arranged in the second illumination area 120b may be adjusted by adjusting an inner diameter of the aperture layer 18.

Figure 20:
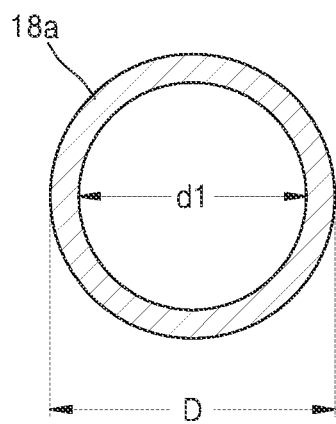
FIG. 20 is a plan view of an aperture layer of light-emitting elements employed in a first area of an illuminator according to an example embodiment.
Figure 21:
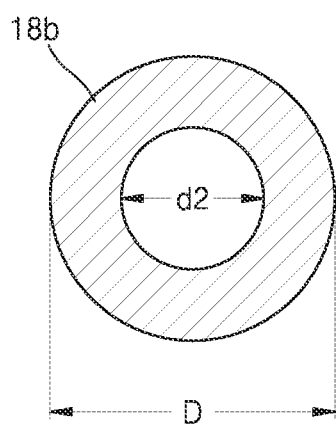
FIG. 21 is a plan view of an aperture layer of light-emitting elements employed in a second area of an illuminator according to an example embodiment.

According to an example embodiment, FIG. 20 is a plan view of a first aperture layer 18a of each of the first light-emitting elements 10a employed in the first illumination area 120a of the illuminator 120. Referring to FIG. 20, an outer diameter of the first aperture layer 18a is D, and an inner diameter thereof is d1. In this case, the first aperture diameter of each of the first light-emitting elements 10a is d1, and a beam diameter of light emitted by each of the first light-emitting elements 10a is d1. FIG. 21 is a plan view of a second aperture layer 18b of each of the second light-emitting elements 10b employed in the second illumination area 120b of the illuminator 120. Referring to FIG. 21, an outer diameter of the second aperture layer 18b is D, and an inner diameter thereof is d2, which may be less than d1. In this case, the second aperture diameter of each of the second light-emitting elements 10b is d2, and a beam diameter of light emitted by each of the second light-emitting elements 10b is d2. Accordingly, when the second light-emitting elements 10b each having the second aperture diameter d2, which is relatively small, are arranged in the second illumination area 120b and the first light-emitting elements 10a each having the first aperture diameter d1, which is relatively large, may be arranged in the first illumination area 120a, the intensity of light emitted by the first illumination area 120a of the illuminator 120 may be greater than that of light emitted by the second illumination area 120b thereof. Sizes of the inner diameters d1 and d2 of the first and second aperture layers 18a and 18b of the first and second light-emitting elements 10a and 10b arranged in the first illumination area 120a and the second illumination area 120b may be determined in consideration of distortion of the lens 150.

Figure 22:
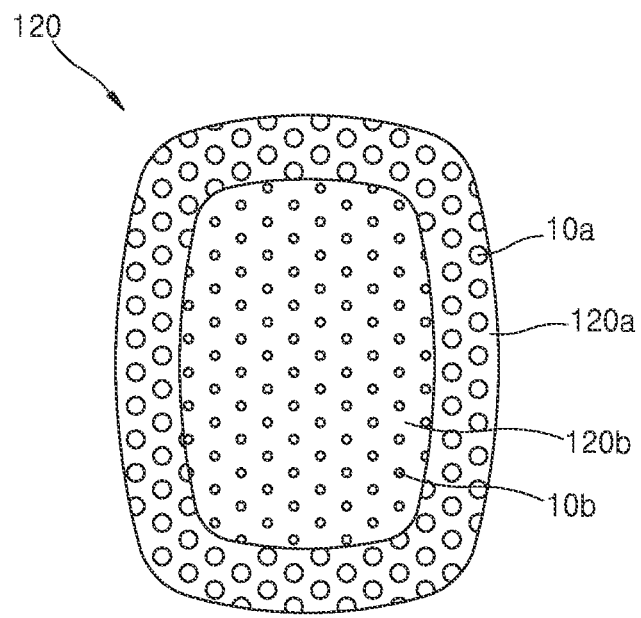
FIG. 22 is a plan view illustrating an example of a layout of light-emitting elements in an illuminator employed in the structured light projector of FIG. 1 when the pattern mask of FIG. 7 is employed.

FIG. 22 is a plan view illustrating an example of a layout of the light-emitting elements 10 in the illuminator 120 employed in the structured light projector 100 of FIG. 1 when the pattern mask 130 of FIG. 7 is used. Referring to FIG. 22, the illuminator 120 may have a quadrangular shape having round corners and convex sides. The illuminator 120 may include a first illumination area 120a facing the peripheral portion 130a of the pattern mask 130, and a second illumination area 120b facing the center portion 130b of the pattern mask 130. Each of the contour shapes of the first illumination area 120a and the second illumination area 120b may be a quadrangular shape having round corners and convex sides.

Similar to the example embodiment of FIG. 18, first light-emitting elements 10a each having a first aperture diameter may be arranged in the first illumination area 120a, and second light-emitting elements 10b each having a second aperture diameter may be arranged in the second illumination area 120b. Densities of the first and second light-emitting elements 10a and 10b in the first and second illumination areas 120a and 120b of the illuminator 120 may be equal to each other, and intensities of currents respectively applied to the first and second light-emitting elements 10a and 10b or time periods during which the currents are respectively applied thereto may be also equal to each other. The first aperture diameter d1 of each of the first light-emitting elements 10a arranged in the first illumination area 120a may be greater than the second aperture diameter d2 of each of the second light-emitting elements 10b arranged in the second illumination area 120b.

Figure 23:
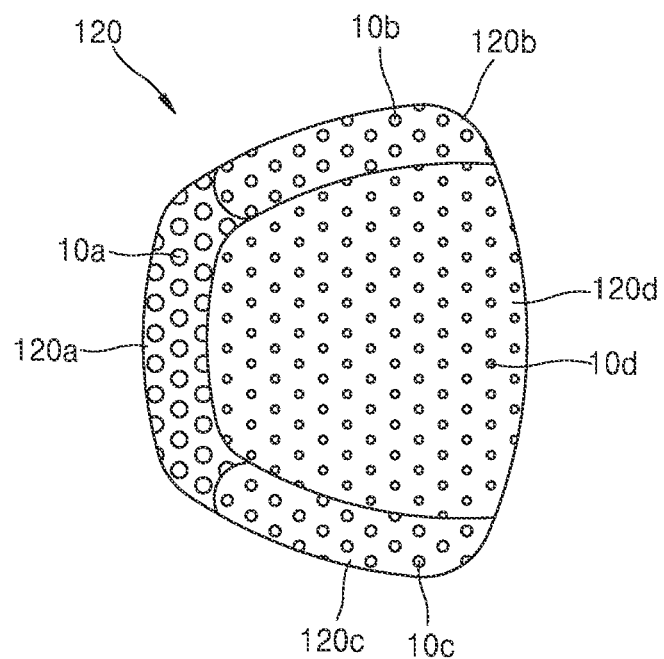
FIG. 23 is a plan view illustrating an example of a layout of light-emitting elements in an illuminator employed in the structured light projector of FIG. 1 when the pattern mask of FIG. 10 is employed.

FIG. 23 is a plan view illustrating an example of a layout of the light-emitting elements 10 in the illuminator 120 employed in the structured light projector 100 of FIG. 1 when the pattern mask 130 of FIG. 10 is used. Referring to FIG. 23, the illuminator 120 may include a first illumination area 120a on the left side, a second illumination area 120b on the upper side, a third illumination area 120c on the lower side, and a fourth illumination area 120d on the right side. First light-emitting elements 10a may be arranged in the first illumination area 120a, second light-emitting elements 10b may be arranged in the second illumination area 120b, third light-emitting elements 10c may be arranged in the third illumination area 120c, and fourth light-emitting elements 10d may be arranged in the fourth illumination area 120d.

Respective densities of the first through fourth light-emitting elements 10a, 10b, 10c, and 10d in the first through fourth illumination areas 120a, 120b, 120c, and 120d may be equal to each other, and respective intensities of currents respectively applied to the first through fourth light-emitting elements 10a, 10b, 10c, and 10d or time periods during which the currents are respectively applied thereto may also be equal to each other. Instead, respective aperture diameters of the first through fourth light-emitting elements 10a, 10b, 10c, and 10d in the first through fourth illumination areas 120a, 120b, 120c, and 120d may be different from each other. For example, the first light-emitting elements 10a arranged in the first illumination area 120a may each have a first aperture diameter, the second and third light-emitting elements 10b and 10c arranged in the second and third illumination areas 120b and 120c may each have a second aperture diameter that is smaller than the first aperture diameter, and the fourth light-emitting elements 10d arranged in the fourth illumination area 120d may each have a third aperture diameter that is smaller than the second aperture diameter. The second light-emitting elements 10b arranged in the second illumination area 120b and the third light-emitting elements 10c arranged in the third illumination area 120c may have the same second aperture diameter.

The structured light projector 100 having the above-described structure may project structured light having uniform brightness. The structured light projector 100 may be employed in various electronic apparatuses. For example, the structured light projector 100 may be employed in 3D object recognition apparatuses. Because the structured light projector 100 provides structured light having uniform brightness, precision of 3D sensing, operation recognition, and the like of 3D object recognition apparatuses may be increased.

Figure 24:
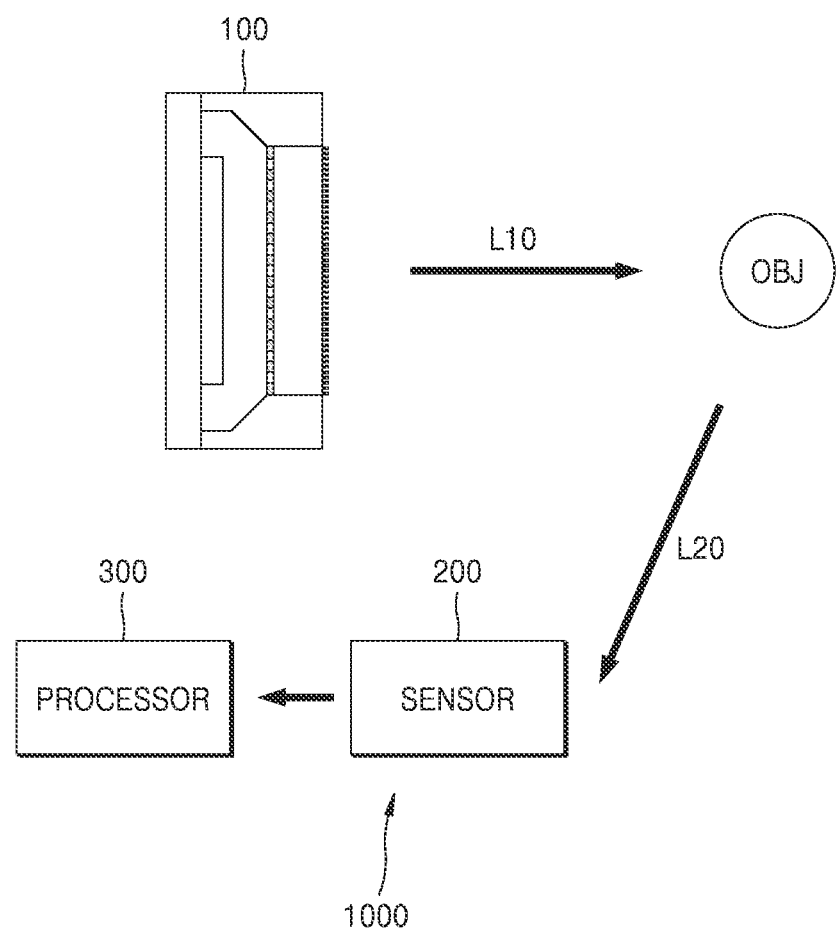
FIG. 24 is a schematic block diagram of a structure of an electronic apparatus according to an example embodiment.

For example, FIG. 24 is a schematic block diagram of a structure of an electronic apparatus 1000 according to an example embodiment. Referring to FIG. 24, the electronic apparatus 1000 may include a structured light projector 100 that radiates structured light L10 to an object OBJ, a sensor 200 that receives structured light L20 reflected from the object OBJ, and a processor 300 that performs a computation for obtaining shape information of the object OBJ from the structured light L20 received by the sensor 200. The sensor 200 may include an array of light detection elements. The sensor 200 may further include a spectrometer for analyzing light reflected by the object OBJ for each wavelength.

The processor 300 may obtain depth information of the object OBJ by comparing the structured light L10 projected to the object OBJ with the structured light L20 reflected by the object OBJ, and may analyze a 3D shape, location, and movement of the object OBJ from the obtained depth information. The structured light L10 projected by the structured light projector 100 may be a pattern mathematically coded to uniquely have an angle and a direction of rays of light and location coordinates of bright and dark points that reach a focusing plane. When the coded pattern is reflected by the object OBJ having a 3D shape, a pattern of the reflected structured light L20 may have a changed shape from the pattern of the radiated structured light L10. Depth information of the object OBJ may be extracted by comparing the patterns and tracing a pattern for each coordinate, and 3D information related to the shape and movement of the object OBJ may be extracted from the extracted depth information. The processor 300 may control overall operations of the electronic device 1000. For example, the processor 300 may control driving of a light source included in the structured light projector 100 or an operation of the sensor 200.

The electronic device 1000 may further include a memory that may store a computation module programmed such that the processor 300 may execute a calculation for extracting 3D information as described above.

Optical devices for controlling a direction of the structured light L10 emitted from the structured light projector 100 such that the structured light L10 heads towards the object OBJ or for modulating the structured light L10 may further be arranged between the structured light projector 100 and the object OBJ.

A result of computation in the processor 300, that is, information about the shape and location of the object OBJ, may be transmitted to another unit or another electronic apparatus. In an example embodiment, the above information may be used in another application module stored in the memory. The other electronic apparatus to which the result is transmitted may be, for example, a display or a printer that outputs the result. In an example embodiment, the other electronic apparatus may be, but is not limited to, autonomous driving equipment (for example, a driverless car, an autonomous car, a robot, and a drone), a smartphone, a smart watch, a personal digital assistant (PDA), a laptop, a personal computer (PC), a wearable device, other mobile or non-mobile computing devices, or an Internet of Things (IOT) device.

The electronic apparatus 1000 may be, but is not limited to, autonomous driving equipment (for example, a driverless car, an autonomous car, a robot, and a drone), portable mobile communication device, a smartphone, a smart watch, a PDA, a laptop, a PC, a wearable device, other mobile or non-mobile computing devices, or an IOT device.

In the electronic apparatuses according to the above-described example embodiments, when software modules or algorithms are involved, these software modules may be stored as program instructions or computer readable codes executable on a processor on a computer-readable medium. Examples of the computer-readable recording medium include magnetic storage media (e.g., ROM, floppy disks, hard disks, etc.), and optical recording media (e.g., CD-ROMs, or digital versatile discs (DVDs)). The computer-readable recording medium can be distributed over network coupled computer systems so that the computer-readable code is stored and executed in a distributive manner. This media can be read by the computer, stored in the memory, and executed by the processor.

Although a structured light projector and an electronic apparatus including the same according to the present disclosure have been described above with reference to the example embodiments illustrated in the drawings, the illustrated example embodiments are only examples, and various modifications may be possible.

While one or more example embodiments have been described with reference to the figures, it will be understood by those of ordinary skill in the art that various changes in form and details may be made therein without departing from the spirit and scope as defined by the following claims.

What is claimed is:

1. A structured light projector comprising:
    an illuminator configured to emit light;
    a pattern mask comprising a plurality of areas, the pattern mask being configured to generate structured light from light emitted by the illuminator based on a pattern of the pattern mask; and
    a lens configured to project the structured light,
    wherein the illuminator comprises a plurality of illumination areas respectively facing the plurality of areas of the pattern mask,
    wherein the plurality of illumination areas comprises at least a first illumination area and a second illumination area,
    wherein a plurality of first light-emitting elements are disposed in the first illumination area and a plurality of second light-emitting elements are disposed in the second illumination area,
    wherein intensities of lights respectively emitted by the plurality of illumination areas are different from each other, a density of the plurality of first light-emitting elements disposed in the first illumination area being different from a density of the plurality of second light-emitting elements disposed in the second illumination area,
    wherein the first illumination area faces a peripheral portion of the pattern mask and the second illumination area faces a center portion of the pattern mask such that the first illumination area is disposed to surround the second illumination area, and wherein the intensities of the lights respectively emitted by the first illumination area and the second illumination area are set based on a distortion of the lens such that brightness of the structured light is uniform across a cross-section of the structured light.

2. The structured light projector of claim 1, wherein an intensity of light emitted by the first illumination area is greater than an intensity of light emitted by the second illumination area.

3. The structured light projector of claim 2, wherein the intensity of the light emitted by the first illumination area and the intensity of the light emitted by the second illumination area are set based on a distortion of the lens such that brightness of the structured light is uniform across a cross-section of the structured light.

4. The structured light projector of claim 2, wherein the density of the plurality of first light-emitting elements disposed in the first illumination area is higher than the density of the plurality of second light-emitting elements disposed in the second illumination area.

5. The structured light projector of claim 2, wherein the pattern mask, the first illumination area, and the second illumination area have rectangular shapes.

6. The structured light projector of claim 2, wherein each of the pattern mask, the first illumination area, and the second illumination area has a quadrangular shape with rounded corners and convex sides.

7. The structured light projector of claim 1, wherein the pattern mask comprises four sides, the four sides comprising a first side and a fourth side opposite each other, and a second side and a third side opposite to each,
a length of the first side is shorter than a length of the fourth side, and
the second side is inclined upward from the fourth side to the first side and the third side is inclined downward from the fourth side to the first side.

8. The structured light projector of claim 7, wherein the pattern mask comprises a first area, a second area, a third area, and a fourth area corresponding to the first side, the second side, the third side, and the fourth side, respectively,
wherein the first illumination area faces the first area of the pattern mask, and the second illumination area faces the second area of the pattern mask, and
wherein the illuminator further comprises a third illumination area facing the third area of the pattern mask, and a fourth illumination area facing the fourth area of the pattern mask.

9. The structured light projector of claim 8, wherein intensities of lights respectively emitted by the second and third illumination areas are greater than an intensity of light emitted by the fourth illumination area, an intensity of light emitted by the first illumination area is greater than the intensities of the lights respectively emitted by the second and third illumination areas, and the intensity of the light emitted by the second illumination area is equal to an intensity of the light emitted by the third illumination area.

10. The structured light projector of claim 9, wherein the intensities of the lights respectively emitted by the first through fourth illumination areas are set based on a distortion of the lens such that brightness of the structured light is uniform across a cross-section of the structured light.

11. The structured light projector of claim 9, wherein the fourth illumination area from among the first through fourth illumination areas has a largest area.

12. The structured light projector of claim 9, wherein the illuminator further comprises a plurality of third light-emitting elements disposed in the third illumination area, and a plurality of fourth light-emitting elements disposed in the fourth illumination area.

13. The structured light projector of claim 12, wherein the density of the plurality of first light-emitting elements disposed in the first illumination area is higher than densities of the plurality of second and third light-emitting elements respectively disposed in the second and third illumination areas,
the densities of the plurality of second and third light-emitting elements respectively disposed in the second and third illumination areas are higher than a density of the plurality of fourth light-emitting elements disposed in the fourth illumination area, and
the density of the plurality of second light-emitting elements disposed in the second illumination area is equal to the density of the plurality of third light-emitting elements disposed in the third illumination area.

14. The structured light projector of claim 1, further comprising:
a transparent substrate spaced apart from the illuminator, wherein
the pattern mask is disposed on a first surface of the transparent substrate, and
the lens is disposed on a second surface of the transparent substrate opposite to the pattern mask.

15. The structured light projector of claim 14, wherein the lens is a meta lens comprising a plurality of nano-size columns.

16. The structured light projector of claim 1, wherein the illuminator further comprises a third illumination area, and a fourth illumination area, and
wherein the intensities of the lights respectively emitted by the first through fourth illumination areas are set based on the distortion of the lens such that brightness of the structured light is uniform across the cross-section of the structured light.

17. The structured light projector of claim 16, wherein the pattern mask comprises a first area, a second area, a third area, and a fourth area corresponding to the first side, the second side, the third side, and the fourth side, respectively, and
wherein the first illumination area faces the first area of the pattern mask, the second illumination area faces the second area of the pattern mask, the third illumination area faces the third area of the pattern mask, and the fourth illumination area faces the fourth area of the pattern mask.

18. An electronic apparatus comprising:
a structured light projector configured to project structured light to an object;
a sensor configured to receive light reflected by the object; and
a processor configured to obtain shape information of the object based on the light received by the sensor,
wherein the structured light projector comprises:
an illuminator configured to emit light;
a pattern mask configured to generate the structured light from light emitted by the illuminator based on a pattern of the pattern mask; and
a lens configured to project the structured light,
wherein the illuminator comprises a plurality of illumination areas respectively facing a plurality of areas of the pattern mask,
wherein the plurality of illumination areas comprises at least a first illumination area and a second illumination area, wherein a plurality of first light-emitting elements are disposed in the first illumination area and a plurality of second light-emitting elements are disposed in the second illumination area, wherein intensities of lights respectively emitted by the plurality of illumination areas are different from each other, a density of the plurality of first light-emitting elements disposed in the first illumination area being different from a density of the plurality of second light-emitting elements disposed in the second illumination area, wherein the first illumination area faces a peripheral portion of the pattern mask and the second illumination area faces a center portion of the pattern mask such that the first illumination area is disposed to surround the second illumination area, and wherein the intensities of the lights respectively emitted by the first illumination area and the second illumination area are set based on a distortion of the lens such that brightness of the structured light is uniform across a cross-section of the structured light.

19. The electronic apparatus of claim 18, wherein the illuminator further comprises a third illumination area, and a fourth illumination area, and wherein the intensities of the lights respectively emitted by the first through fourth illumination areas are set based on the distortion of the lens such that brightness of the structured light is uniform across the cross-section of the structured light.

20. The electronic apparatus of claim 19, wherein the pattern mask comprises a first area, a second area, a third area, and a fourth area corresponding to the first side, the second side, the third side, and the fourth side, respectively, and wherein the first illumination area faces the first area of the pattern mask, the second illumination area faces the second area of the pattern mask, the third illumination area faces the third area of the pattern mask, and the fourth illumination area faces the fourth area of the pattern mask.

* * * * *